(12) United States Patent
Norito et al.

(10) Patent No.: US 6,740,428 B2
(45) Date of Patent: May 25, 2004

(54) SLIDE MEMBER

(75) Inventors: Akinori Norito, Inuyama (JP);
Toshiaki Kawachi, Inuyama (JP);
Hideo Ishikawa, Inuyama (JP);
Takayuki Shibayama, Inuyama (JP);
Kunihiko Iwasaki, Ube (JP); Cristian Petrica Lungu, Ube (JP)

(73) Assignee: Daido Metal Company Ltd., Nagoya (JP)

( * ) Notice: Subject to any disclaimer, the term of this patent is extended or adjusted under 35 U.S.C. 154(b) by 0 days.

(21) Appl. No.: 10/379,731

(22) Filed: Mar. 6, 2003

(65) Prior Publication Data
US 2003/0180572 A1 Sep. 25, 2003

(30) Foreign Application Priority Data
Mar. 19, 2002 (JP) ........................................ 2002-076377

(51) Int. Cl.[7] ................................................. F16C 33/12
(52) U.S. Cl. .................... 428/673; 384/907; 384/907.1; 384/912; 384/913
(58) Field of Search ................................ 428/614, 673; 384/907, 907.1, 912, 913

(56) References Cited

U.S. PATENT DOCUMENTS

| | | | | |
|---|---|---|---|---|
| 3,385,677 A | * | 5/1968 | Schreiner et al. | 75/233 |
| 3,755,164 A | * | 8/1973 | Van Wyk | 75/231 |
| 4,256,489 A | * | 3/1981 | Van Wyk | 75/231 |
| 5,199,553 A | * | 4/1993 | Shinohara et al. | 200/265 |
| 5,938,864 A | * | 8/1999 | Tomikawa et al. | 148/435 |

FOREIGN PATENT DOCUMENTS

| | | | |
|---|---|---|---|
| GB | 2217347 | * | 10/1989 |
| JP | 09-111370 | * | 4/1997 |
| WO | WO 99/41512 | * | 8/1999 |

* cited by examiner

Primary Examiner—John J. Zimmerman
(74) Attorney, Agent, or Firm—Browdy and Neimark

(57) ABSTRACT

In a slide member comprising a base member and a slide layer including a first surface fixed to the base member and a second surface being opposite to the first surface in a thickness direction of the slide layer and capable of contacting another member in such a manner that the another member is movable on the second surface, the slide layer includes silver as a main component of the slide layer and a solid lubricant.

20 Claims, 6 Drawing Sheets

SLIDE MEMBER

BACKGROUND OF THE INVENTION

The present invention relates to a slide member on which another member can slide smoothly.

In prior art slide members, a surface of each of the slide members on which surface another member slides includes lead (Pb).

BRIEF SUMMARY OF THE INVENTION

An object of the present invention is to provide a slide member on whose surface another member can slide smoothly, and in which fatigue resistance, wear resistance and anti-seizure property of the surface are improved.

In a slide member for supporting another member thereon movably, comprising a base member, and a slide layer including a first surface fixed to the base member and a second surface being opposite to the first surface in a thickness direction of the slide layer and capable of contacting ("contact" includes a contact through a lubricant, for example, a liquid lubricant between the slide member and the another member) the another member in such a manner that the another member is movable on the second surface, according to the present invention, the slide layer includes silver as a main component of the slide layer and a solid lubricant.

Since the slide layer includes both silver as the main component of the slide layer and the solid lubricant, all of the fatigue resistance, wear resistance and anti-seizure property of the second surface are kept at high degrees respectively.

The solid lubricant may include at least one of graphite, amorphous carbon, molybdenum disulfide and boron nitride. The amorphous carbon may include Diamond-like-carbon.

It is preferable for keeping both the anti-seizure property and an adhesion strength between the first surface and the base member at respective high levels that a content of the solid lubricant decreases from the second surface toward the first surface, and/or that a content of the solid lubricant at the second surface is higher than a content of the solid lubricant at the first surface.

It is preferable for keeping the adhesion strength between the first surface and the base member at high level that a content of the silver increases from the second surface toward the first surface, and/or that a content of the silver at the second surface is lower than a content of the silver at the first surface.

It is preferable for keeping both the anti-seizure property and the adhesion strength between the first surface and the base member at respective high levels that the slide layer includes a first film and a second film stacked in the thickness direction, the first film includes the first surface, the second film includes the second surface, and a content of the solid lubricant in the first film is smaller than a content of the solid lubricant in the second film.

It is preferable for keeping the adhesion strength between the first surface and the base member that a content of the silver in the first film increases from a boundary between the first and second films toward the first surface, and/or that a content of the silver in the first film is higher than a content of the silver in the second film.

It is preferable for keeping the adhesion strength between the first surface and the base member that the base member is metallic to facilitate the diffusion between the first surface and the base member.

It is preferable for keeping all of the fatigue resistance, wear resistance and anti-seizure property of the second surface at high degrees respectively that the slide layer includes the solid lubricant by 0.05–10 mass %, and/or that a peak ratio of G peak/D peak is not less than 0.5 and not more than 5.0 when G peak and D peak are measurable from the second surface of the slide layer by Raman analysis.

DETAILED DESCRIPTION OF THE INVENTION

Figure 1:
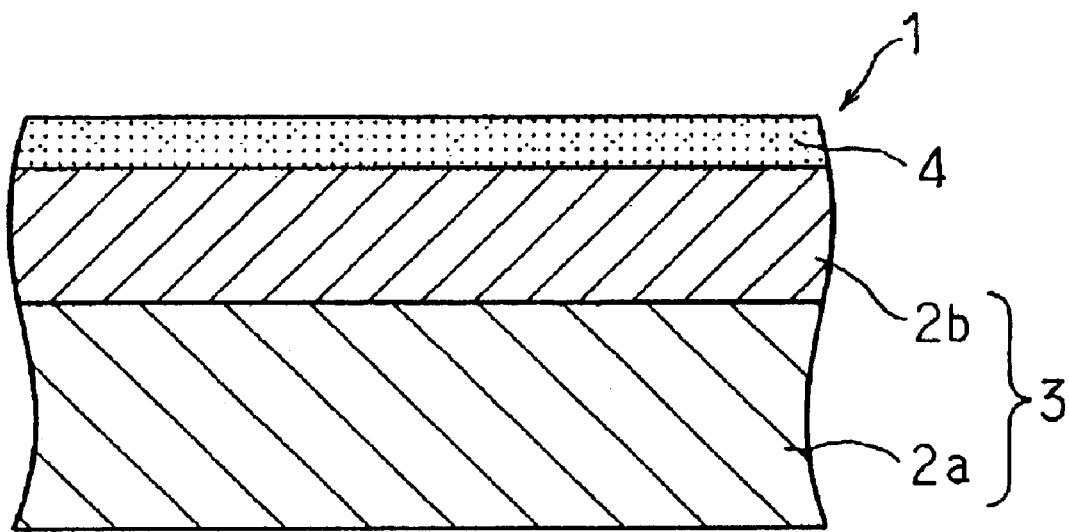
FIG. 1 is a cross-sectional view showing a first embodiment of a slide member according to the present invention.

In a first embodiment as shown in FIG. 1, a slide member or bearing 1 has a steel backing metal 2a, a bearing alloy (for example, an aluminum alloy or a copper apply, particularly for example, bronze) layer 2b, and an overlay layer 4 as the claimed slide layer stacked in a thickness direction of the slide member 1. The overlay layer 4 has a slide surface as the claimed second surface on which another member (not shown) is capable of sliding. A base member 3 is formed by the steel backing metal 2a and the bearing alloy layer 2b.

The overlay layer 4 includes silver as a main component of the overlay layer 4 and amorphous carbon (for example, Diamond-Like-Carbon (DLC)) as solid lubricant. If the overlay layer 4 includes silver and is prevented from including the solid lubricant, the overlay layer 4 may be formed by wet-plating or dry-plating. If the overlay layer 4 includes both silver and the solid lubricant, the overlay layer 4 is formed preferably by the dry-plating, for example, sputtering. A thickness of the overlay layer 4 is, for example, 10–20 μm, and a content of the DLC in the overlay layer 4 is 0.4–8.5 mass % while the remainder part of the overlay layer 4 is silver.

Figure 2:
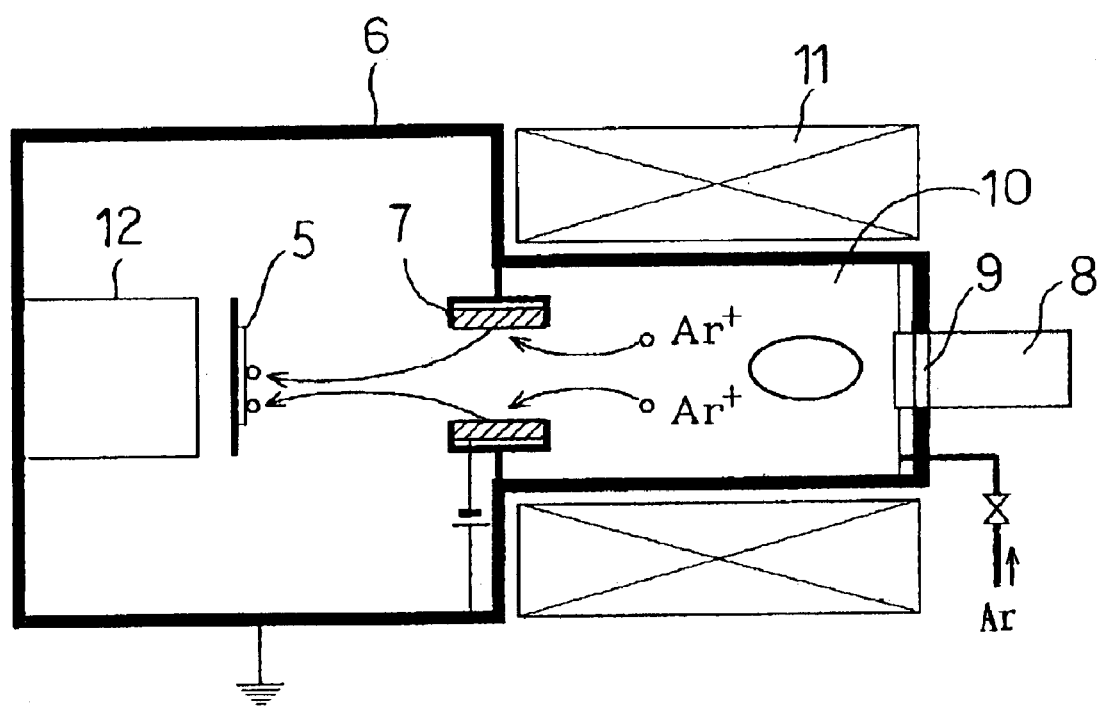
FIG. 2 is a schematic cross-sectional view showing an ECR sputtering device.

A test sample of the overlay layer 4 is made by ECR (Electron Cyclotron Resonance) sputtering device as shown in FIG. 2. A substrate 5 as the base member and a cylindrical target 7 are set in a chamber 6. The substrate 5 of bronze has a mirror-finished surface to be treated by the sputtering device so that the overlay layer 4 is formed over the mirror-finished surface, and the target 7 as a material of overlay layer 4 includes a ring-shaped silver as a material of a main component of the overlay layer 4 and a graphite ring as a material of DLC. A content ratio between silver and graphite is adjusted by changing a number of the ring-shaped silver and a number of the graphite ring, for example, the number of the ring-shaped silver is seven, and the number of the graphite ring is three. When the overlay layer 4 is prevented from including a component other than silver, the target 7 includes only the ring-shaped silver.

High-frequency (for example, 2.45 GHz) oscillating magnetic field generated by a magnetron 8 is applied into a plasma chamber 10 through a crystal window 9, and a magnetic field of 87500 μT (=875G) is generated by a magnetic coil 11 while a density of argon ion is made maximum under a layer depositing pressure. Electron in the plasma chamber 10 helically drifts with cyclotron motion under a circumference of the magnetic field and high-frequency oscillating electric field. When a strength of the magnetic field is 87500 μT, a condition for magnetron resonance is satisfied so that electron in the plasma chamber 10 is accelerated. Therefore, a degree of electrolytic dissociation of sputtered neutral by electron impact is increased to generate ionized plasma under a relatively high vacuumed degree.

The electrons in the plasma generated in the plasma chamber 10 is withdrawn to a side of test piece (substrate 5) by a cooperation with a gradient of divergent magnetic field so that negative electric space charge is generated by the withdrawn electrons and argon ion (Ar$^+$) is withdrawn to neutralize the electric space charge. The withdrawn argon ion is injected into the target 7 to which electric voltage is applied, to deposit silver and DLC on the surface of the substrate 5 by sputtering so that the overlay layer 4 of 15 μm thickness is formed on the surface of the substrate 5. In this case, the substrate 5 is rotated by 10–15 rpm, and heated at 150° C. by a heater 12.

A first (Ag/DLC) sample of the overlay layer 4 includes silver and DLC of 1.7 mass %, and a second (Ag) sample of the overlay layer 4 includes only silver.

These two samples are tested by a ball-on-disk friction tester (made by CSME Inc., with a high-carbon stainless bearing steel (SUJ2) ball of 6 mm diameter). A bearing load is changed to 1N, 3N, 5N and 7N, and a sliding speed is kept constant at 0.1 m/s. Sliding distance is 100 m when the bearing load is 1N, and is 50 m when the bearing load is 3N, 5N and 7N.

Figure 3:
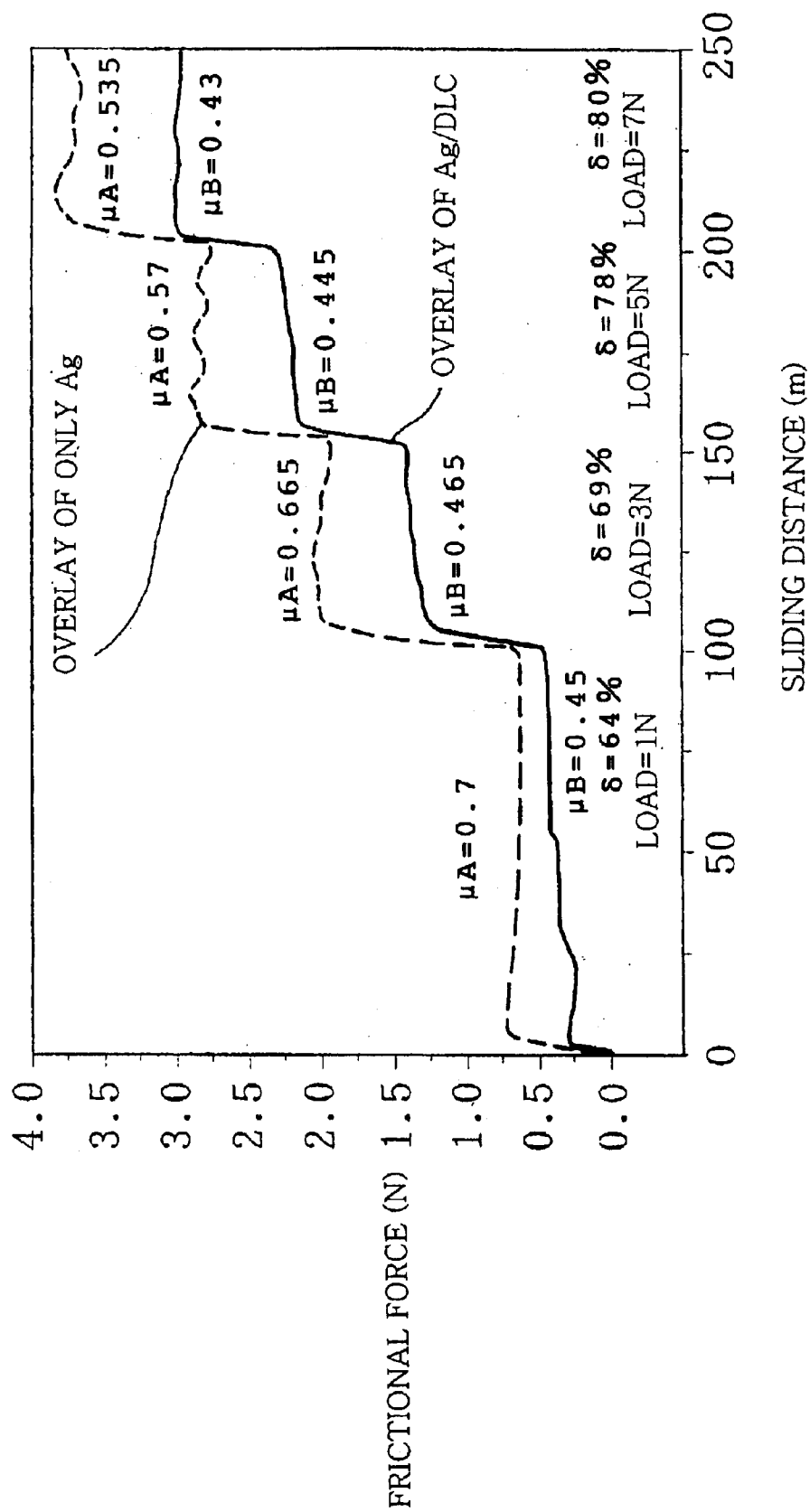
FIG. 3 is a diagram showing a relation ship among a slide length a frictional force, a kind of slide surface, and a force borne by the slide surface.

As shown in FIG. 3, a frictional coefficient (frictional force/bearing load) μA of the second (Ag) sample is decreased from 0.7 to 0.535 in accordance with an increase of the bearing load, and the frictional coefficient μB of the first (Ag/DLC) sample changed between 0.465 and 0.43 in accordance with the increase of the bearing load. A frictional coefficient μ0 of a surface of the substrate 5 without the overlay layer 4 is 0.78±0.05 in the same test. Therefore, the frictional coefficient μB of the first (Ag/DLC) sample is decreased to about 57% of the frictional coefficient μ0, and the frictional coefficient HA of the second (Ag) sample is decreased to about 82% of the frictional coefficient μ0.

Figure 4:
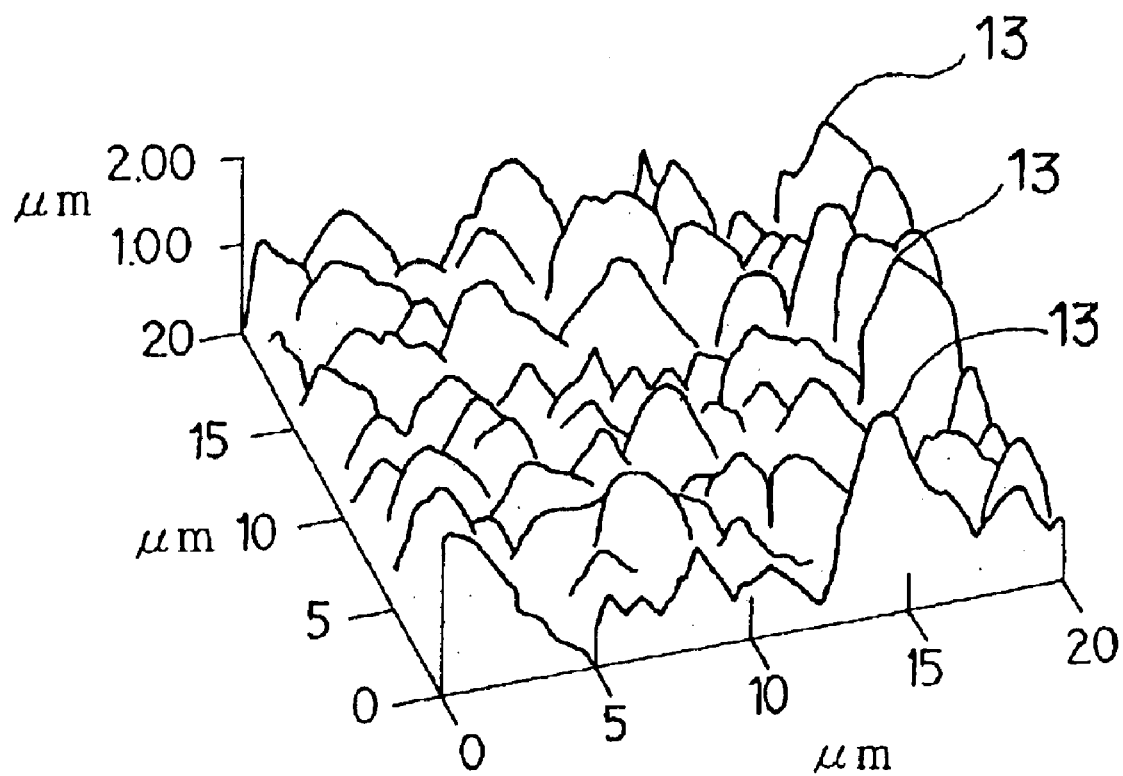
FIG. 4 is an enlarged view showing a shape of the slide surface.

The frictional coefficient μB of the first (Ag/DLC) sample is relatively low in comparison with the frictional coefficient μA of the second (Ag) sample in the whole bearing load range by about 64–80% (δ=μB/μA) of the frictional coefficient μA of the second (Ag) sample. A reason of this decrease of the frictional coefficient μB of the first (Ag/DLC) sample relative to the frictional coefficient μA of the second (Ag) sample is that DLC acts as a solid lubricant, and the surface including both silver and DLC has numerous conical portions 13 as shown in FIG. 4 to decrease contact area between the surface and the testing ball. Therefore, since the surface includes both silver and DLC, the frictional coefficient is kept low while anti-seizure property of the surface is improved.

The silver is particularly effective for improving the fatigue resistance and wear resistance in comparison with a slide element whose main component is lead, and the solid lubricant is particularly effective for improving the anti-seizure property with decreasing a friction coefficient in comparison with a slide element whose main component is silver and which does not include solid lubricant, so that the fatigue resistance, wear resistance and anti-seizure property can be kept at respective high degrees even when the pressure applied to the bearing surface is increased in comparison with the prior art.

Figure 5:
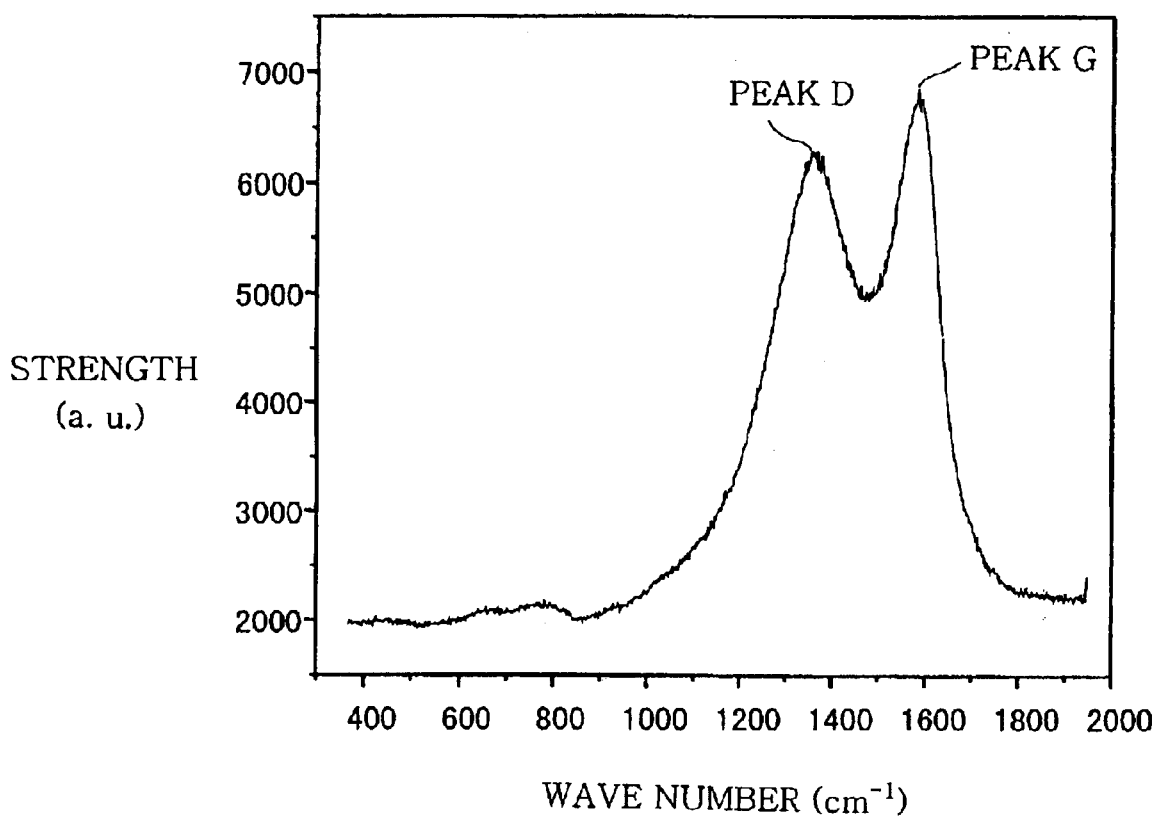
FIG. 5 is a diagram showing a relationship between a wave number and a strength obtained by Raman analysis.

As shown in FIG. 5 of Raman spectroscopic analysis result obtained when an energizing light beam is an argon laser (wave length 514.5 nm), G peak (band) is detected at wave number of about 1600 cm$^{-1}$, D peak (band) is detected at wave number of about 1300 cm$^{-1}$, and this fact shows that DLC of high amorphous degree is included in the overlay 4. The G peak relates to SP2 bonding component (flat face structure), and the D peak relates to loss of long-distance order. A ratio I between G peak and D peak (G peak/D peak) is preferably not less than 0.5 and not more than 5.0. The ratio I shows characteristics of DLC (amount of hydrogen in DLC, hardness of DLC and frictional coefficient of DLC).

When the ratio I is less than 0.5, a rate of the SP3 bonding component (regular tetrahedral structure) is great so that the hardness and frictional coefficient of DLC in the overlay layer 4 are extremely high to deteriorate another member to be supported on the surface of the overlay layer 4 and it is not suitable as the solid lubricant. When the ratio I is more than 5.0, the loss of long-distance order is small so that the amount of hydrogen in DLC is small, and the hardness and frictional coefficient of DLC in the overlay layer 4 are extremely high to deteriorate another member to be supported on the surface of the overlay layer 4 and it is not suitable as the solid lubricant.

When the ratio I is not less than 0.8 and not more than 3.0, the DLC has, particularly, the hardness suitable for preventing the another member from being deteriorated, and the frictional coefficient being sufficiently low.

Incidentally, in the result shown in FIG. 5, a strength of G peak is about 6800 (a. u.), a strength of D peak is about 6300 (a. U.), and the ratio I is about 1.08. Therefore, the DLC of high amorphous degree has low frictional coefficient suitable for solid lubricant.

Figure 6:
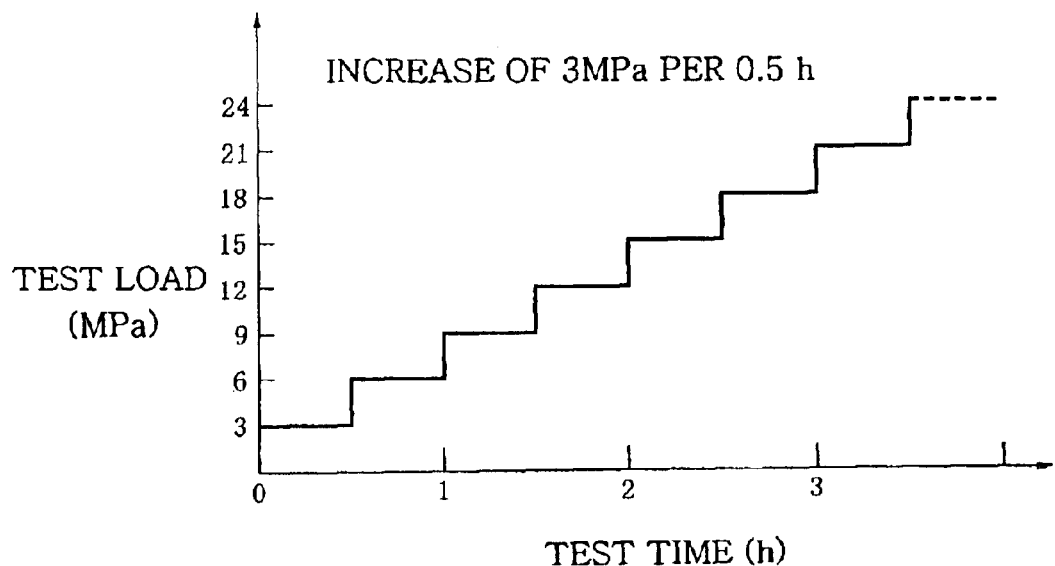
FIG. 6 is a diagram showing a relationship among a time proceeding and a bearing load increase in an anti-seizure property measuring test.

Seizure test, wear test and fatigue test for tribology characteristics of the overlay layer 4 were brought about. Table 1 shows experimental conditions for the seizure test, and FIG. 6 shows seizure test pattern. A sticking load is a load obtained when a temperature of a reverse surface of the bearing opposite to the surface for contacting the another member to be supported increases abruptly to 200° C. or a frictional force increases abruptly to 4.9 N*m while the load is increased by 3 MPa per each 0.5 hour as shown in FIG. 6. Table 2 shows experimental conditions for the wear test, Table 3 shows experimental conditions for the fatigue test, and Table 4 shows experimental results of seizure, wear and fatigue tests.

TABLE 1

| parameter | condition |
| --- | --- |
| test piece dimension | land inner diameter 20 mm |
|  | land outer diameter 27.2 mm |
| velocity | 2.0 m/s |
| lubricant | SAE#30 |
| lubrication type | oil bath |
| lubricant temperature | room temperature |
| kind of another member | steel |

TABLE 1-continued

| parameter | condition |
|---|---|
| surface roughness of another member | Ra = 1.5–3.0 |

TABLE 2

| parameter | condition |
|---|---|
| test piece dimension | land inner diameter 20 mm |
|  | land outer diameter 27.2 mm |
| surface pressure | 9.8 MPa |
| velocity | 0.01 m/s |
| lubricant | SAE#30 |
| lubrication type | oil bath |
| lubricant temperature | 150° C. |
| kind of another member | steel |
| surface roughness of another member | Ra = 5–10 |

TABLE 3

| parameter | condition |
|---|---|
| bearing dimension | φ56 × 1 17 mm |
| rotational speed | 3250 rpm |
| circumferential speed | 9 m/s |
| lubricant | SAE#20 equivalent |
| lubricant temperature | 100° C. |
| lubricating pressure | 0.49 MPa |
| kind of another member | steel |
| surface roughness of another member | Ra = 5–10 |

TABLE 4

|  | piece number | Carbon content (mass %) | upper limit surface pressure for preventing seizure (MPa) | thickness decrease by wear (mm) | upper limit surface pressure for preventing fatigue breaking (MPa) |
|---|---|---|---|---|---|
| examples of the invention | | | | | |
|  | 1 | 0.4 | 27 | 0.006 | 120 |
|  | 2 | 1.7 | 30 | 0.005 | 120 |
|  | 3 | 5.9 | 30 | 0.004 | 115 |
|  | 4 | 8.5 | 30 | 0.003 | 115 |
| comparative sample | | | | | |
|  | 1 | 0 | 24 | 0.009 | 115 |
|  | 2 | 12 | 27 | 0.003 | 80 |
|  | 3 | Pb—8Sn—2Cu | 30 | 0.015 | 80 |

The overlay layers of the test pieces 1–4 of the invention have carbon (DLC) contents of 0.4, 1.7, 5.9 and 8.5 mass percents respectively with the main component of silver, the overlay layer of the comparative sample 1 does not include carbon and includes only silver, the overlay layer of the comparative sample 2 has carbon (DLC) content of 12 mass percent with the main component of silver, and the overlay of the comparative sample 3 does not include carbon and includes Pb-8Sn-2Cu.

As shown in Table 4, the test pieces 1–4 as the examples of the invention have the upper limit surface pressure for preventing seizure not less than 27 MPa, the thickness decreases by wear on the test pieces 1–4 as the examples of the invention are not more than 0.006 mm, and the upper limit surface pressures for preventing fatigue breaking of the test pieces 1–4 as the examples of the invention are not less than 115 MPa. In comparison with the test piece 1 as the comparative sample, the anti-seizure property and wear resistance of the test pieces 1–4 as the examples of the invention are extremely superior to those of the test piece 1 as the comparative sample, and the fatigue resistance of the test pieces 1–4 as the examples of the invention is substantially equal to that of the test piece 1 as the comparative sample.

In comparison with the test piece 2 as the comparative sample having the upper limit surface pressure of 27 MPa for preventing seizure, the thickness decrease of 0.003 mm by wear and the upper limit surface pressure of 80 MPa for preventing fatigue breaking, the fatigue resistances of the test pieces 1–4 as the examples of the invention are extremely superior to those of the test piece 2 as the comparative sample, and the anti-seizure properties of the test pieces 1–4 of the invention are substantially equal to that of the test piece 2 as the comparative sample. In comparison with the test piece 3 as the comparative sample having the upper limit surface pressure of 30 MPa for preventing seizure, the thickness decrease of 0.015 mm by wear and the upper limit surface pressure of 80 MPa for preventing fatigue breaking, the fatigue and wear resistances of the test pieces 1–4 of the invention are extremely superior to those of the test piece 1 as the comparative sample.

Therefore, it is preferable for a content of DLC in the overlay layer 4 to be 0.05–10 mass %. If the content of DLC in the overlay layer 4 is less than 0.05 mass %, the lubrication characteristic by the DLC is not sufficient. If the content of DLC in the overlay layer 4 is more than 10 mass %, the mechanical strength and the fatigue resistance of the overlay layer 4 are not sufficient.

Figure 7:
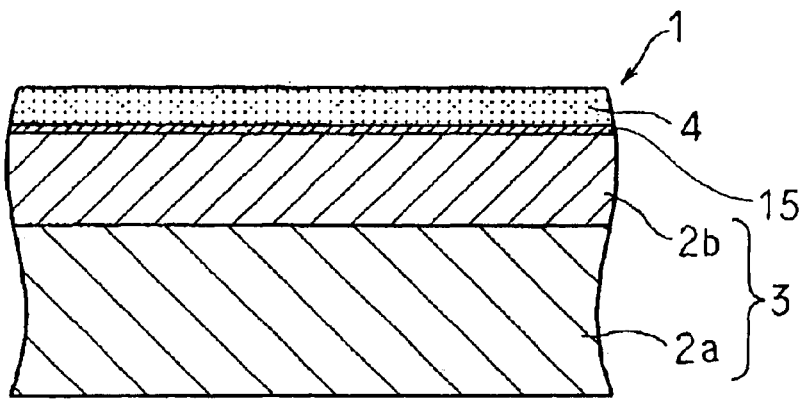
FIG. 7 is a cross-sectional view showing a second embodiment of the slide member according to the present invention.

In a second embodiment of the invention as shown in FIG. 7, an intermediate layer 15 as the claimed first film is arranged between the overlay layer 4 including DLC and silver and the base member 3.

In the ECR sputtering device, firstly, only silver is used as the target 7 to form the intermediate layer 15, while argon gas is supplied into the ECR sputtering device after being vacuumed, and argon ion ($Ar^+$) is injected into the target 7 to deposit the silver layer of thickness about 1.5 μm on the substrate 5 as the base member 3.

Subsequently, $CH_4$ (methane) gas is introduced into the plasma chamber 10 with a volume rate of about 10% of a volume rate of the argon gas. C—H bond in the $CH_4$ gas in the plasma chamber 10 is broken by ion bombardment and/or electron bombardment to be divided to hydrogen atom and carbon atom. The hydrogen atom and carbon atom may be ionized by the ion bombardment and/or electron bombardment in the plasma chamber 10.

The electrons in the plasma generated in the plasma chamber 10 is withdrawn to the side of test piece (substrate 5) by the cooperation with the gradient of the divergent magnetic field so that the negative electric space charge is generated by the withdrawn electrons and argon ion ($Ar^+$) is withdrawn to neutralize the electric space charge. The withdrawn argon ion is injected into the target 7 to which electric voltage is applied, to deposit silver on the surface of the substrate 5 by sputtering so that the intermediate layer 15 is formed.

Subsequently, carbon and hydrogen to which the CH₄ gas is divided as well as the sputtered silver are urged by the electrons withdrawn to the side of test piece (substrate 5) and the argon ion flow (plasma flow) to be withdrawn to the side of test piece (substrate 5). The sputtered silver as well as the carbon and hydrogen withdrawn to the side of test piece (substrate 5) by the plasma flow impinge on the surface of the intermediate layer 15 to deposit the overlay layer 4 on the surface of the intermediate layer 15.

Table 5 shows a result of the fatigue test applied to the second embodiment. The test condition of the fatigue test applied to the second embodiment is the same as that of the fatigue test applied to the first embodiment. The piece number "2" denotes the first embodiment without the intermediate layer and the piece number "5" denotes the second embodiment with the intermediate layer 15.

TABLE 5

|  | piece number | carbon content (mass %) | intermediate layer | upper limit surface pressure for preventing fatigue breaking (MPa) |
|---|---|---|---|---|
| examples of the invention |  |  |  |  |
|  | 2 | 1.7 | none | 120 |
|  | 5 | 1.7 | Ag | 130 |

As known from Table 5, the intermediate layer 15 is effective for improving the fatigue resistance.

Silver content may increase in the intermediate layer 15 from a boundary face between the intermediate layer 15 and the base member 3 toward a boundary face between the intermediate layer 15 and the overlay layer 4. Silver content at the boundary face between the intermediate layer 15 and the overlay layer 4 is not less than silver content in the overlay layer 4, for example more than silver content in the overlay layer 4.

In the intermediate layer 15, the following formula may be satisfied when the content of silver at the boundary face between the intermediate layer 15 and the overlay layer 4 is ρA and the content of silver at the boundary face between the intermediate layer 15 and the base member 3 is ρB, and the content of silver may decrease from the boundary face between the intermediate layer 15 and the base member 3 toward the boundary face between the intermediate layer 15 and the overlay layer 4.

$$0 < (\rho B - \rho A) \leq 10$$

The solid lubricant included by the overlay layer 4 may includes at least one of graphite, amorphous carbon, molybdenum disulfide and boron nitride.

The overlay layer 4 may be formed by dry plating other than sputtering, for example, ion plating, vacuum depositing or the like, or wet plating.

One of the backing metal 2a and the bearing alloy layer 2b may be deleted from the base member 3 so that the other one of the backing metal 2a and the bearing alloy layer 2b may be the claimed base member. A soft layer of for example, Pb, Sn, In, synthetic resin or the like may cover the overlay layer 4 so that the soft layer absorbs an error in shape of the slide member and/or another member to be supported on the slide member and/or in alignment between the slide member and the another member.

What is claimed is:

1. A slide member for supporting another member thereon movably, comprising
    a base member, and
    a slide layer including a first surface fixed to the base member and a second surface being opposite to the first surface in a thickness direction of the slide layer and capable of contacting the another member in such a manner that the another member is movable on the second surface,
    wherein the slide layer includes silver as a main component of the slide layer and a solid lubricant,
    wherein the slide layer includes a first film and a second film stacked in the thickness directions the first film includes the first surface, the second film includes the second surface, and a content of the solid lubricant in the first film is lower than a content of the solid lubricant in the second film.

2. A slide member according to claim 1, wherein a content of the silver at the second surface is lower than a content of the silver at the first surface.

3. A slide member for supporting another member thereon movably, comprising
    a base member, and
    a slide layer including a first surface fixed to the base member and a second surface being opposite to the first surface in a thickness direction of the slide layer and capable of contacting the another member in such a manner that the another member is movable on the second surface,
    wherein the slide layer includes silver as a main component of the slide layer and a solid lubricant,
    and a content of the silver increases from the second surface toward the first surface.

4. A slide member for supporting another member thereon movably, comprising
    a base member, and
    a slide layer including a first surface fixed to the base member and a second surface being opposite to the first surface in a thickness direction of the slide layer and capable of contacting the another member in such a manner that the another member is movable on the second surface,
    wherein the slide layer includes silver as a main component of the slide layer and a solid lubricant,
    and a content of the silver at the second surface is lower than a content of the silver at the first surface.

5. A slide member according to claim 4, wherein the solid lubricant includes at least one of graphite, amorphous carbon, molybdenum disulfide and boron nitride.

6. A slide member according to claim 5, wherein the amorphous carbon includes Diamond-like-carbon.

7. A slide member according to claim 5, wherein the slide layer includes the solid lubricant by 0.05–10 mass %.

8. A slide member according to claim 7, wherein the slide layer includes a first film and a second film stacked in the thickness direction, the first film includes the first surface, the second film includes the second surface, and a content of the solid lubricant in the first film is lower than a content of the solid lubricant in the second film.

9. A slide member according to claim 7, wherein G peak and D peak are measurable from the slide layer by Raman analysis, and a peak ratio of G peak/D peak is not less than 0.5 and not more than 5.0.

10. A slide member according to claim 5, wherein the slide layer includes a first film and a second film stacked in the thickness direction, the first film includes the first surface, the second film includes the second surface, and a content of the solid lubricant in the first film is lower than a content of the solid lubricant in the second film.

11. A slide member according to claim 4, wherein the slide layer includes the solid lubricant by 0.05–10 mass %.

12. A slide member according to claim 4, wherein a content of the solid lubricant decreases from the second surface toward the first surface.

13. A slide member according to claim 4, wherein a content of the solid lubricant at the second surface is higher than a content of the solid lubricant at the first surface.

14. A slide member according to claim 4, wherein a content of the silver increases from the second surface toward the first surface.

15. A slide member according to claim 4, wherein the slide layer includes a first film and a second film stacked in the thickness direction, the first film includes the first surface, the second film includes the second surface, and a content of the solid lubricant in the first film is lower than a content of the solid lubricant in the second film.

16. A slide member according to claim 15, wherein a content of the silver in the first film increases from a boundary between the first and second films toward the first surface.

17. A slide member according to claim 15, wherein a content of the silver in the first film is higher than a content of the silver in the second film.

18. A slide member according to claim 15, wherein G peak and D peak are measurable from the slide layer by Raman analysis, and a peak ratio of G peak/D peak is not less than 0.5 and not more than 5.0.

19. A slide member according to claim 4, wherein G peak and D peak are measurable from the slide layer by Raman analysis, and a peak ratio of G peak/D peak is not less than 0.5 and not more than 5.0.

20. A slide member according to claim 4, wherein the solid lubricant includes at least one of graphite, amorphous carbon, molybdenum disulfide and boron nitride.

* * * * *